United States Patent [19]

Nomizu et al.

[11] Patent Number: 4,782,440
[45] Date of Patent: Nov. 1, 1988

[54] LOGIC SIMULATOR USING SMALL CAPACITY MEMORIES FOR STORING LOGIC STATES, CONNECTION PATTERNS, AND LOGIC FUNCTIONS

[75] Inventors: Nobuyoshi Nomizu; Tohru Sasaki, both of Tokyo, Japan

[73] Assignee: NEC Corporation, Tokyo, Japan

[21] Appl. No.: 761,281

[22] Filed: Aug. 1, 1985

[30] Foreign Application Priority Data

Aug. 3, 1984 [JP] Japan .................... 59-162843

[51] Int. Cl.[4] .................... G06F 15/20; G06F 7/38
[52] U.S. Cl. .................... 364/200; 364/900; 364/578; 371/23
[58] Field of Search ... 364/200 MS File, 900 MS File, 364/716, 578; 371/25, 23

[56] References Cited

U.S. PATENT DOCUMENTS

| | | | |
|---|---|---|---|
| 3,934,231 | 1/1976 | Armstrong | 364/900 |
| 3,961,250 | 1/1976 | Snethen | 371/25 |
| 4,120,043 | 10/1978 | Su | 364/716 |
| 4,306,286 | 12/1981 | Cocke et al. | 364/200 |
| 4,324,093 | 7/1982 | Miyoshi | 364/578 |
| 4,527,249 | 7/1985 | Van Brunt | 364/578 |
| 4,541,071 | 9/1985 | Ohmori | 364/900 |
| 4,587,625 | 5/1986 | Marino, Jr. et al. | 364/578 |
| 4,628,471 | 12/1986 | Schuler et al. | 371/23 |
| 4,656,580 | 4/1987 | Hitchcock, Sr. et al. | 364/200 |
| 4,697,241 | 9/1987 | Lavi | 364/900 |
| 4,725,975 | 2/1988 | Sasaki | 364/900 |

Primary Examiner—Raulfe B. Zache
Assistant Examiner—Danh Phung
Attorney, Agent, or Firm—Sughrue, Mion, Zinn, Macpeak & Seas

[57] ABSTRACT

A logic simulator for simulating operation of a logic circuit is provided with gates divisible into successive levels according to a connection pattern between the gates. A pattern memory (16) memorizes the connection pattern as a bit sequence representative of direct connections between each gate of each level to the gates of a preceding level. A function memory (17) memorizes logic functions of the respective gates. Responsive to input logic states of each level, the bit sequence for the gates of the level under consideration, and the logic functions of the respective gates of that level, a calculator (25) calculates output logic states of that level as input logic states of a succeeding level successively for the gates of the level in question. For a higher speed of simulation, the logic circuitry may be divided into a predetermined number of gate groups, each consisting of gates of the successive levels. Each of the pattern and the function memories is divided into parts for the respective gate groups. In order to make the logic simulator have a further reduced memory capacity, the gates of each preceding level may be classified into gate blocks. A block specifier is additionally used. Under the circumstances, it is sufficient that each bit sequence should represent direct connections to the gate blocks. The calculator is supplied with the output logic states of each gate block.

4 Claims, 3 Drawing Sheets

LOGIC SIMULATOR USING SMALL CAPACITY MEMORIES FOR STORING LOGIC STATES, CONNECTION PATTERNS, AND LOGIC FUNCTIONS

BACKGROUND OF THE INVENTION:

This invention relates primarily to a hardware logic simulator for use in carrying out logic simulation of a logic circuit or device which may be an LSI.

Hardware logic simulators are revealed in U.S. patent application Ser. No. 513,489 filed July 13, 1983, by Tohru Sasaki now U.S. Pat. No. 4,725,975, one of the present applicants, and Ser. No. 514,900 filed July 18, 1983, by Kenji Ohmori, now U.S. Pat. No. 4,541,071 both for assignment to the instant assignee. Various other hardware logic simulators are also known. Generally speaking of the prior art hardware logic simulators, an overall logic operation of a logic circuit is simulated by storing results of simulation in memories. The memories must have an enormous memory capacity. For example, the number of memory elements or cells amounts to $2^n$ when the logic circuit has n inputs.

SUMMARY OF THE INVENTION

It is therefore an object of the present invention to provide a hardware logic simulator which needs a least possible amount of memory capacity.

Other objects of this invention will become clear as the description proceeds.

According to this invention, there is provided a logic simulator for carrying out logic simulation of a logic circuit comprising a plurality of gates divisible into successive levels according to a connection pattern between inputs and outputs of the gates and which comprises: an input memory for memorizing logic states of the respective inputs of the gates of each level; pattern memory means for memorizing the connection pattern as a pattern bit sequence for each gate of each level wherein the pattern bit sequence is representative of direct connections of the gate under consideration to the gates of a preceding level; function memory means for memorizing logic functions of the respective gates of the logic circuit; calculating means responsive to the logic states of each level selected as a particular level, the pattern bit sequences for the respective gates of the particular level, and the logic functions of the respective gates of the particular level for calculating successively, for the gates of the particular level, those logic states as calculated states which the respective outputs of the gates of the particular level have; and supplying means for supplying the calculated states to the input memory as the logic states of the respective inputs of the gates of a succeeding level.

DESCRIPTION OF THE PREFERRED EMBODIMENTS

Figure 1:
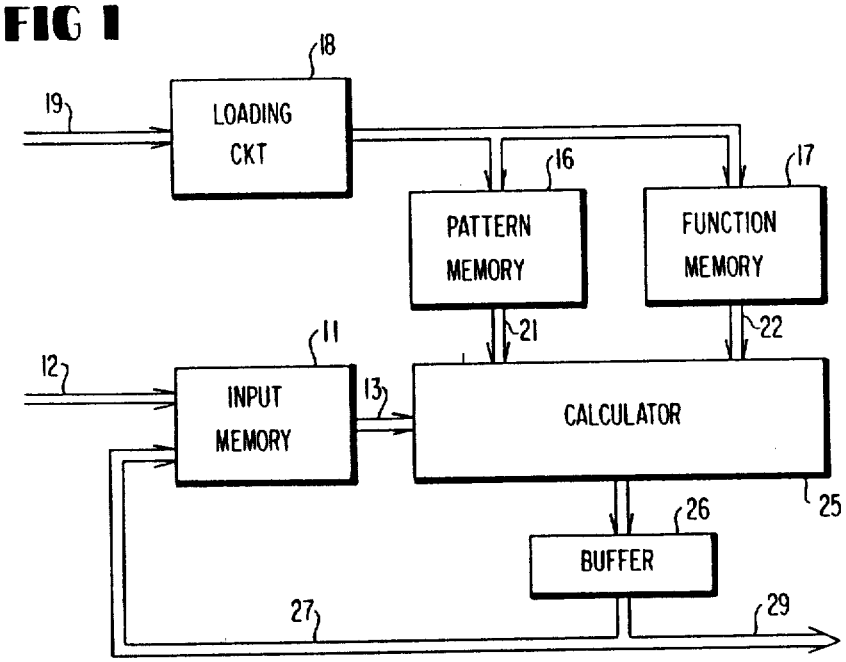
FIG. 1 is a block diagram of a logic simulator according to a first embodiment of the instant invention.
Figure 2:
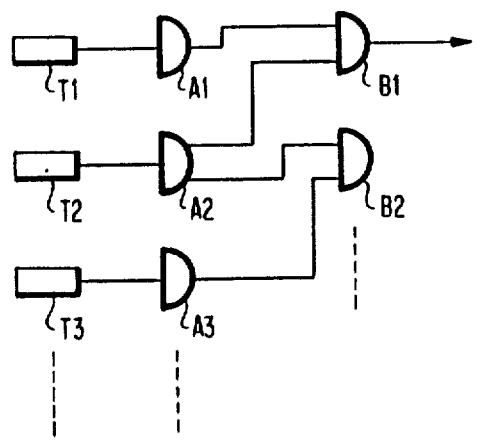
FIG. 2 shows in blocks a part of a logic circuit for use in describing the operation of the logic simulator illustrated in FIG. 1.

Referring to FIGS. 1 and 2, a logic simulator shown for carrying out logic simulation of a logic circuit or device which comprises a plurality of various gates. In an example depicted in FIG. 2, the logic circuit has circuit input terminals T1, T2, T3, . . . and comprises a plurality of gates A1, A2, A3, . . . , B1, B2, . . . which have various logic functions or carry out various individual logic operations. According to a first embodiment of the present invention, the logic simulator comprises an input memory 11 for memorizing, at first, circuit input logic states which should be given to the respective circuit input terminals T (suffix omitted) and thence to some of the gates, such as the gates A (suffix omitted). The circuit input logic states will be referred to hereinafter as primitive logic states for brevity of description. The primitive logic states are given to the input memory 11 through a circuit input signal line 12, which is depicted as consisting of a plurality of conductors for a bit-parallel signal.

In the manner described in the above-cited Sasaki patent and Ohmori patent, it is possible to divide the gates A, B (suffix omitted), and so forth into successive levels according to a connection pattern which is specific to the logic circuit under consideration and is representative of connections between gate inputs and gate outputs of the gates A, B, and so on. More particularly, the gates A are given the primitive logic states as gate input logic states. The gates A are classified into level one or a first level. Depending on the logic functions of the respective level-one gates A and the level-one gate input logic states, the gate outputs of the gates A have level-one gate output logic states. In the example being illustrated, the gates B are given the level-one gate output logic states as gate input logic states. Such gates B are classified into level two or a second level.

In the manner which will later become clear, the input memory 11 memorizes the output logic states of the respective gate outputs for each level as the input logic states of the respective gate inputs of the gates of a succeeding level in correspondence to the individual gates of the succeeding level. Such gate input logic states are produced for each level as a state bit sequence to an intermediate signal line 13. Incidentally, it is discussed in detail in the Sasaki patent that the gates A, B, and others of the logic circuit can be divided into the successive levels in a variety of manners.

A pattern memory 16 stores the connection pattern as a pattern bit sequence for each gate of each level. The pattern memory 16 therefore memorizes such pattern bit sequences for the respective gates of the logic circuit. Each pattern bit sequence represents presence and absence of direct connections of the gate in question to the gates of a preceding level. The preceding level, as herein called, may not be a single level. More specifically, only some of the gate inputs of the gate under consideration may be directly connected to the gate outputs of the gate of a next preceding level while others of the gate inputs may be directly connected to the gate outputs of the gate of a level which further precedes the next preceding level. Merely for convenience of description, it wil be assumed that the levels are selected one at a time as a particular level. It is therefore possible to say that the pattern memory 16 is for memorizing the pattern bit sequence for each gate of the particular level.

The pattern bit sequence may be formed for each gate of the particular level by allotting one binary bit to each of the gates of the preceding level. In the illustrated example, the level-two gate B1 is directly connected to the level-one gates A1 and A2 and is not connected to other level-one gates A3 and so forth. The pattern bit sequence is therefore memorized in the pattern memory 16 for the gate B1 with one and the other of binary values given to the bits assigned to the gates A1 and A2 and to the bits allocated to the gates A3 and others, respectively. The pattern bit sequence for the gate B1 may be a sequence of binary bits 00111... Similarly, the pattern bit sequence for the gate B2 may be another sequence of binary bits 1001...

A function memory 17 stores logic functions of the respective gates of the logic circuit. According to the Sasaki patent, the logic functions are memorized as "types" in a "first" memory circuit. As for the Ohmori patent, the logic functions are memorized as "logic operations" in a "gate" memory unit. It will be readily possible for one skilled in the art to give the logic functions for the function memory 17 in consideration of either of the Sasaki or the Ohmori patent.

A loading circuit 18 loads the pattern memory 16 and the function memory 17 with the pattern bit sequences for the respective gates of the logic circuit and with the logic functions thereof, respectively. Depending on the logic circuit for which the overall logic operation should be simulated for various primitive logic states, the pattern bit sequence and the logic function are supplied for each gate of the logic circuit to the loading circuit 18 through another circuit input signal line 19. For each gate of the logic circuit, the pattern and the function memories 16 and 17 produce the pattern bit sequence for that gate and a function signal representative of the logic function thereof to pattern and function output signal lines 21 and 22, respectively.

A calculator 25 calculates, gate by gate of each level or of the particular level, the gate output logic states as calculated states. When the gate has a plurality of gate outputs in the manner exemplified for the gate A2, the calculated states are produced for the respective gate outputs of the gate under consideration. When the gate has only one gate output like the gates A1, A3, and B1, the calculated state alone is produced therefor. In either event, the calculator 25 is operable like a simulating unit described in the Sasaki patent and delivers the calculated state or states for each gate of the particular level to a buffer memory 26.

Such calculated states are produced for the gates of the particular level with the calculator 25 supplied from the input memory 11 with the state bit sequence representative of the logic states of the respective gate inputs of the gates under consideration, from the pattern memory 16 with the pattern bit sequences for the respective gates in question, and from the function memory 17 with the logic functions of the respective gates to which attention is directed. On calculating the output logic state or states for the gate B1, the particular level is the level two. In the manner which is described heretobefore and will presently be described, the output logic states of the level-one gates A are already stored in the input memory 11 as the input logic states of the level-two gates B in correspondence to the individual level-two gates B. The calculator 25 carries out logic operation between the state bit sequence for the level two, namely, for the gate inputs of the level-two gates B, and the pattern bit sequence for the gate B1 to provide a resulting bit sequence in consideration of the logic function of the gate B1 under consideration.

In the logic operation for the level-two gate B1, the binary bits of the state bit sequence for the level-two gates B are left untouched in the resulting bit sequence at bit positions which are assigned to the level-one gates A1 and A2 having gate outputs directly connected to gate inputs of the gate B1 and are represented by binary zero bits in the pattern bit sequence for the level-two gate B1. Other binary bits of the state bit sequence for the level-two gates B are given in the resulting bit sequence a common binary value determined in consideration of the logic function of the gate B1 so as not to affect a like logic operation which is to be carried out on the resulting bit sequence and the logic function of the gate B1. For example, the common value is the binary one value and the binary zero value when the gate B1 is an AND-series gate, such as an AND gate or a NAND gate, and an OR-series gate, such as an OR gate, a NOR gate, or an Exclusive OR gate, respectively.

After the resulting bit sequence is obtained for the gate B1, the calculator 25 carries out the afore-mentioned like logic operation to provide the calculated state or states which the gate B1 has as the output logic state or states when supplied with the input logic states given for the gate B1 in the state bit sequence. The calculator 25 calculates the output logic states successively for the gates B1, B2, and others of the level two, namely, of the particular level.

In the manner exemplified above for the level-two gate B1, the output logic states are calculated at first for the gates A of the level one and stored in the buffer memory 26. The output logic states are fed to the input memory 11 through a connection signal line 27 and stored therein as the input logic states for the level-two gates B. In this manner, the output logic states are stored in the input memory 11 eventually for the penultimate level. The buffer memory 26 is thereafter loaded with the output logic states for the ultimate level. These output logic states are produced through a circuit output signal line 29 as circuit output logic states or an eventual result of simulation for the overall logic operation of the logic circuit and may be stored in the input memory 11 like the output logic states for the first through the penultimate levels.

Figure 3:
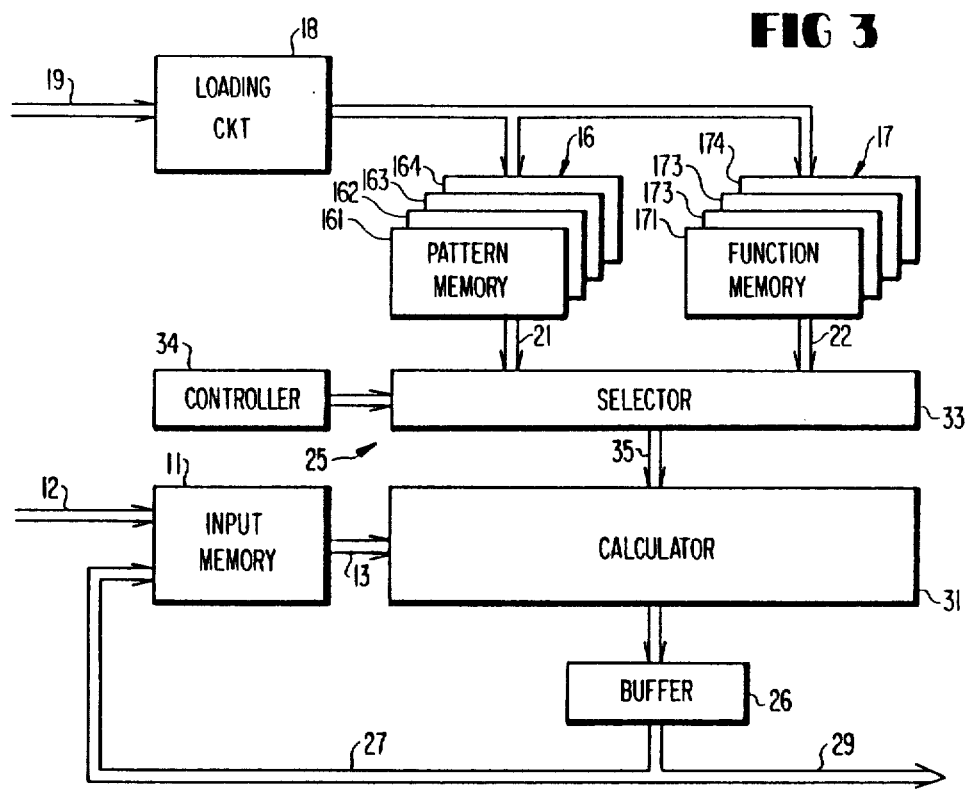
FIG. 3 is a block diagram of a logic simulator according to a second embodiment of this invention.

Referring to FIG. 3, a logic simulator according to a second embodiment of this invention comprises similar parts designated by like reference numerals. The logic simulator is operable when the logic circuit is divided into a predetermined number of gate groups, each consisting of the gates of the successive levels. It will be assumed only for clarity of description that the predetermined number is equal to four. The gate groups will be referred to therefore as first through fourth gate groups. Such gate groups are similar to "groups" described in the Sasaki patent in conjunction with FIG. 5 thereof.

In FIG. 3, the input memory 11 memorizes the logic states for the respective inputs of the gates of each level in the first through the fourth gate groups in correspondence to the individual gates of the level under consideration in the gate groups. The input memory 11 is therefore substantially equivalent to that described in connection with FIG. 1.

The pattern memory 16 comprises first through fourth pattern memory parts 161, 162, 163, and 164 in correspondence to the first through the fourth gate groups, respectively. The i-th pattern memory part 16i is for memorizing the pattern bit sequence for each gate which is selected at a time as a particular gate from the gates of the particular level in the i-th gate group. Each pattern bit sequence may be a sequence of binary bits for those respective gates of a preceding level which have concern with the particular gate in at least one of the gate groups. Although the loading circuit is designated by the reference numeral 18, it should be noted that the loading circuit 18 should load the pattern memory parts 161 through 164 with the pattern bit sequences for the gates of the respective gate groups.

The function memory 17 similarly comprises first through fourth function memory parts 171, 172, 173, and 174 for the respective gate groups. Each function memory part 17i is for memorizing the logic functions of the respective gates of the gate group to which the function memory part 17i corresponds. The loading circuit 18 loads the function memory parts 171 to 174 with the logic functions of the gates of the respective gate groups.

The calculator 25 comprises a unit calculator 31 and a selecting circuit which comprises, in turn, a selector 33 and a controller 34 therefor. The selector 33 is supplied at a time from the pattern memory parts 161 through 164 with four pattern bit sequences for four gates of the respective gate groups and from the function memory parts 171 through 174 with four logic functions of the four gates under consideration. Controlled by the controller 34, the selector 33 successively selects one of the four pattern bit sequences and one of the four logic functions for one of the four gates at a time for delivery to the unit calculator 31 through a common signal line 35. In this manner, the selector 33 cyclically selects the pattern memory parts 161 to 164 and the function memory parts 171 to 174.

The unit calculator 31 is operable like the calculator 25 described in conjunction with FIG. 1 and is supplied from the input memory 11 with the state bit sequence representative of the logic states memorized therein for the gates of the particular level in the first through the fourth gate groups. Cyclically for the first through the fourth gate groups, the unit calculator 31 is supplied from the selector 33 with the pattern bit sequences for the respective gates of the particular level and the logic functions of the respective gates of the particular level. The unit calculator 31 thereby calculates the output logic states of the gates of the particular level in the first through the fourth gate groups.

Figure 4:
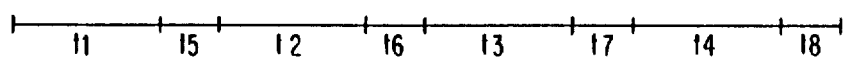
FIGS. 4(A) and (B) collectively show a time chart for use in describing the operation of the logic simulator depicted in FIG. 3.
Figure 4:
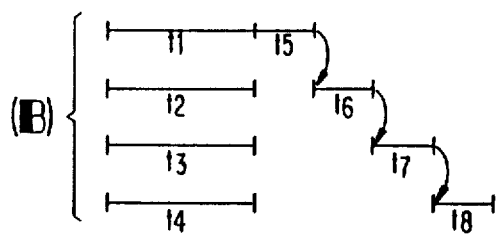

Turning to FIG. 4 (A), operation will be reviewed for the logic simulator illustrated with reference to FIG. 1. For four successive ones of the gates of the particular level, the memories 11, 16, and 17 are read in first through fourth time intervals t1, t2, t3, and t4, respectively, which are intermittently in series. The output logic states of the respective gates are calculated in time intervals t5, t6, t7, and t8 which follow the first through the fourth time intervals t1 to t4, respectively.

Further turning to FIG. 4 (B), a higher speed of simulation is achieved by the logic simulator illustrated with reference to FIG. 3. It will be assumed merely for convenience of description of the simulation speed that four consecutive gates of each level are divided into the first through the fourth gate groups, respectively. One or more of the four gate groups may consist of the gates of a common number which is different from the number of gates in other gate groups. For these four gates of the particular level, the pattern bit sequences and the function signals are read from the pattern memory parts 161 through 164 and from the function memory parts 171 through 174 into the selector 33 in the first through the fourth time intervals t1 to t4 which are in parallel. The unit calculator 31 successively calculates the output logic states of the four gates in the time intervals t5 through t8 by using those pattern bit sequences and those logic functions which are successively selected by the selector 33 for the respective ones of the four gates during the cyclic selection.

Figure 5:
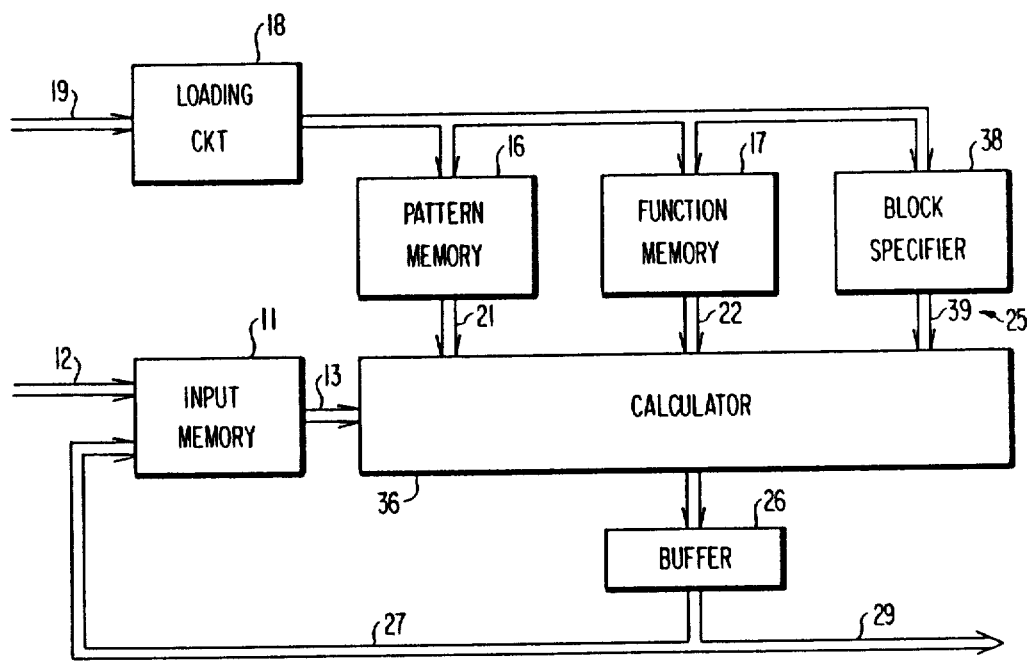
FIG. 5 is a block diagram of a logic simulator according to a third embodiment of this invention.

Referring now to FIG. 5, a logic simulator according to a third embodiment of this invention comprises similar parts which are designated again by like reference numerals. The loading circuit alone is, however, designated by the reference numeral 18 with a prime. This is because the loading circuit 18' is different from that described in connection with FIG. 1 to a certain extent in the manner which will shortly become clear.

For the gates of each level, namely, of the particular level, the gates of the preceding level are classified into gate blocks in consideration of presence and absence of the direct connections between gate inputs of the gates of the particular level and gate outputs of the gates of the respective gate blocks. Block numbers are assigned to the respective gate blocks. It should be noted that the gate blocks, as herein called, are different from "logic blocks" described in the Sadaki patent application. In correspondence to the respective gate blocks, the state bit sequence is separated into state bit sequence parts.

In the manner described hereinabove, the logic states of the respective gate inputs of the gates of the particular level are the logic states of the respective gate outputs of the gates of the preceding level. It is possible to understand that the circuit input terminals T correspond to gates of level zero which precedes the level one in the successive levels. The input memory 11 therefore memorizes the logic states of the respective gate outputs of the preceding level as the state bit sequence parts in correspondence to the block numbers.

The pattern bit sequence is formed for the particular gate in compliance with presence and absence of the direct connections to the individual gate blocks. In other words, the pattern bit sequence is formed for the particular gate with attention directed to the gate blocks on discriminating the presence of the direct connection to the gate block from the absence. The pattern memory 16 memorizes such pattern bit sequences for the respective gates of the logic circuit. The pattern memory 16 may therefore have a reduced memory capacity. Incidentally, the function memory 17 is not different from that thus far described.

The calculator 25 comprises a unit calculator 36 and a block specifier 38. The block specifier 38 stores those block numbers for the gates of the logic circuit which are stored therein by the loading circuit 18' in correspondence to the respective gates of the logic circuit. For the particular gate, the block specifier 38 specifies one of the block numbers as a specified number that is assigned to the gate block having the direct connection to the particular gate. The specified number is delivered to a number output signal line 39. In other words, the block specifier 38 specifies one of the gate blocks as a specified block that is directly connected to the particular gate. It is now understood that a combination of the intermediate signal line 13 and the number output signal line 39 serves as an arrangement coupled to the input memory 11 and the block specifier 38 for specifying the logic states of the respective outputs of the gates of the specified block as specified states.

The unit calculator 36 is similar to the unit calculator 31 (FIG. 3). The unit calculator 36 is, however, supplied from the block specifier 38 with the specified number and uses one of the state bit sequence parts that is representative of the specified states. The unit calculator 36 thereby calculates the calculated state or states for the particular gate and thus the calculated states for the gates of the particular level.

While this invention has so far been described in specific conjunction with a few embodiments thereof, it will now clearly be understood that each of the logic circuits illustrated with reference to FIGS. 1, 3, and 5 comprises memories 11, 16, and 17 of a least possible amount of memory capacity. This is because the logic states, the connection pattern, and the logic functions are memorized in the respective memories whereby a drastic reduction is made possible for those results of simulation which should be memorized. It is possible to carry out the calculation by software by representing the connection pattern by pointers in the manner known in the art. Furthermore, it is possible in the input memory 11 to substitute the output logic states accumulated for each level in the buffer memory 26 for the input logic states for a next preceding level. In this event, the output logic states of each level may be delivered to a printer or a like recorder through the circuit output signal line 29 for a record on a recording medium in order to make it possible to check the output logic states of the respective levels. The calculator 25, 31, or 36 may or may not calculate the output logic states for each level in the order exemplified in FIG. 2 by the gates A1, A2, A3, . . . or the gates B1, B2, and so forth. It is possible to divide the gates of the logic circuit into the gate groups and furthermore classify the gates of each preceding level of the gate groups into the gate blocks.

What is claimed is:

1. A logic simulator for carrying out logic simulation of a logic circuit comprising successive groups of gates, said logic simulator comprising:

an input memory for memorizing input bits which are input to the gates of a selected one of said successive groups, said successive groups being selected in sequence;

pattern memory means for memorizing pattern bit sequences corresponding to respective ones of said gates, each of said pattern bit sequences consisting of a plurality of bits such that, for a particular pattern bit sequence corresponding to a particular group of gates, each bit corresponds to a respective gate of the group preceding said particular group and represents a connection state of said respective gate to a gate in said particular group;

function memory means for memorizing logic functions of the gates of said logic circuit;

calculating means, responsive to said input bits supplied from said input memory, the particular pattern bit sequence corresponding to the gates of said particular group and supplied from said pattern memory means, and the logic functions of the gates of said particular group and supplied from said function memory means, for calculating successively, for the gates of said particular group, output bits which are produced from the gates of said particular group; and supplying means for supplying said output bits to said input memory as said input bits to be given to the gates belonging to the next successive group to be selected as said particular group.

2. A logic simulator as claimed in claim 1, wherein:

said pattern memory means consists of a pattern memory for memorizing each of said pattern bit sequences for each of said gates of each of said groups; and said function memory means consists of a function memory for memorizing said logic functions for the gates of said circuit.

3. A logic simulator as claimed in claim 1, wherein:

said pattern memory means comprises a plurality of pattern memories in one-to-one correspondence with said gate groups, each said pattern memory memorizing the pattern bit sequence for each gate of the corresponding gate group;

said function memory means comprises a plurality of function memories in one-to-one correspondence with said gate groups, each said function memory memorizing the logic functions of the gates of the corresponding gate group;

said calculating means comprising:

a selector for cyclically selecting each of said pattern memories and each of said function memories for the gates of said particular group; and a calculator responsive to the input bits memorized in said input memory for the gates of said particular group, the pattern bit sequences memorized in the pattern memories selected for the gates of said particular group, and the logic functions memorized in the function memories selected for the gates of said particular group, for calculating said output bits for the gates of said particular group.

4. A logic simulator as claimed in claim 1, the gates of said group preceding said particular group being classified, for the gates of said particular group, into a plurality of gate blocks, wherein:

said input memory memorizes the input bits of the respective outputs of the gates of said preceding group for the respective gate blocks;

said pattern memory means memorizing said particular pattern bit sequence for each gate of said particular group to indicate presence or absence of the direct connection to the gates of said preceding group;

said calculating means comprising:

a block specifier for specifying the gate block for each gate of said particular group as a specified block;

means coupled to said input memory and said block specifier for specifying the logic states of the gates of said specified block as specified states; and a calculator responsive to said specified states, the particular pattern bit sequence for the respective gates of said particular group, and the logic functions of the respective gates of said particular group for calculating said output bits for the gates of said particular group.

* * * * *

UNITED STATES PATENT AND TRADEMARK OFFICE
CERTIFICATE OF CORRECTION

PATENT NO. : 4,782,440

DATED : November 1, 1988

INVENTOR(S) : Nobuyoshi NOMIZU et al

It is certified that error appears in the above-identified patent and that said Letters Patent is hereby corrected as shown below:

COLUMN 5, LINE 2     Delete "161" and insert --16i--.

COLUMN 5, LINE 17    Delete "171" and insert --17i--.

COLUMN 6, LINE 28    Delete "Sadaki" and insert --Sasaki--.

Signed and Sealed this

Twenty-fifth Day of July, 1989

Attest:

DONALD J. QUIGG

*Attesting Officer*   *Commissioner of Patents and Trademarks*